(12) United States Patent
Chen et al.

(10) Patent No.: US 7,863,197 B2
(45) Date of Patent: Jan. 4, 2011

(54) METHOD OF FORMING A CROSS-SECTION HOURGLASS SHAPED CHANNEL REGION FOR CHARGE CARRIER MOBILITY MODIFICATION

(75) Inventors: Huajie Chen, Danbury, CT (US); Dureseti Chidambarrao, Weston, CT (US); Judson R. Holt, Wappingers Falls, NY (US); Qiqing C. Ouyang, Yorktown Heights, NY (US); Siddhartha Panda, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 1156 days.

(21) Appl. No.: 11/306,721

(22) Filed: Jan. 9, 2006

(65) Prior Publication Data
US 2008/0258180 A1    Oct. 23, 2008

(51) Int. Cl.
H01L 21/302    (2006.01)
H01L 21/00    (2006.01)

(52) U.S. Cl. .......... 438/739; 438/40; 438/300; 438/706

(58) Field of Classification Search .......... 438/40, 438/300, 713, 738, 739, 694–695, 700–703, 438/706–709, 733, 736
See application file for complete search history.

(56) References Cited

U.S. PATENT DOCUMENTS

| | | | |
|---|---|---|---|
| 3,602,841 A | 8/1971 | McGroddy | |
| 4,498,953 A * | 2/1985 | Cook et al. | 438/738 |
| 4,665,415 A | 5/1987 | Esaki et al. | |
| 4,689,115 A * | 8/1987 | Ibbotson et al. | 438/706 |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |

(Continued)

FOREIGN PATENT DOCUMENTS

| | | |
|---|---|---|
| EP | 01/162362 | 6/1989 |
| EP | 0 967 636 A2 | 12/1999 |
| EP | 1 174 928 A1 | 1/2002 |
| WO | WO 94/27317 | 5/1993 |
| WO | WO 02/45156 A2 | 6/2002 |

OTHER PUBLICATIONS

Rim, et al., "Transconductance Enhancement in Deep Submicron Strained-Si n-MOSFETs", International Electron Devices Meeting, 26, 8, 1, IEEE, Sep. 1998.

(Continued)

*Primary Examiner*—Ori Nadav
(74) *Attorney, Agent, or Firm*—Scully, Scott, Murphy & Presser, P.C.; Joseph P. Abate, Esq.

(57) ABSTRACT

A method for fabricating the semiconductor structure include a semiconductor substrate having a cross-section hourglass shaped channel region. A stress imparting layer is located adjacent the channel region. The hourglass shape may provide for enhanced vertical tensile stress within the channel region when it is longitudinally compressive stressed by the stress imparting layer.

9 Claims, 4 Drawing Sheets

U.S. PATENT DOCUMENTS

| | | | |
|---|---|---|---|
| 5,354,695 | A | 10/1994 | Leedy |
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,710,054 | A * | 1/1998 | Gardner et al. .............. 438/304 |
| 5,840,593 | A | 11/1998 | Leedy |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,326,667 | B1 | 12/2001 | Sugiyama et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | Von Ehrenwall |
| 6,476,462 | B2 | 11/2002 | Shimizu et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,599,789 | B1 * | 7/2003 | Abbott et al. ............... 438/161 |
| 6,603,156 | B2 | 8/2003 | Rim |
| 6,767,802 | B1 | 7/2004 | Maa et al. |
| 6,774,015 | B1 | 8/2004 | Cohen et al. |
| 6,815,278 | B1 | 11/2004 | Ieong et al. |
| 6,815,738 | B2 | 11/2004 | Rim |
| 6,828,214 | B2 | 12/2004 | Notsu |
| 6,828,628 | B2 | 12/2004 | Hergenrother et al. |
| 6,831,292 | B2 | 12/2004 | Currie et al. |
| 6,869,880 | B2 * | 3/2005 | Krishnarej et al. .......... 438/689 |
| 7,217,604 | B2 * | 5/2007 | Furukawa et al. ........... 438/154 |
| 7,410,864 | B2 * | 8/2008 | Temmler .................... 438/245 |
| 2001/0009784 | A1 | 7/2001 | Ma et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2005/0285203 | A1 * | 12/2005 | Fukutome et al. ........... 257/368 |
| 2006/0138398 | A1 * | 6/2006 | Shimamune et al. .......... 257/19 |

OTHER PUBLICATIONS

Rim, et al. "Characteristics and Device Design of Sub-100 nm Strained Si N- and PMOSFETs", 2002 Symposium on VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Ootsuka, et al. "A Highly Dense, High-Performance 130nm node CMOS Technology for Large Scale System-on-a-Chip Application", International Electron Device Meeting, 23.5.1, IEEE, Apr. 2000.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC): A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

Ouyang, et al. "Two-Dimensional Bandgap Engineering in a Novel Si/SiGe pMOSFETS With Enhanced Device Performance and Scalability", Microelectronics Research Center, pp. 151-154, 2000 IEEE.

Sayama et al., "Effect of <Channel Direction for High Performance SCE Immune pMOSFET with Less Than 0.15um Gate Length"ULSI Development Center, pp. 27.5.1-27.5.4, 1999 IEEE.

Yin, et al., "Fully-depleted Strained-Si on Insulator NMOSFETs without Relaxed SiGe Buffers", IEDM, 2003 IEEE.

Yin, et al., "Strain partition of Si/SiGe and $SiO_2$/SiGe on compliant substrates", Applied Physics Letters, vol. 82, No. 22, Jun. 2, 2003, pp. 3853-3855.

Huang, et al., "Relaxation of a Strained Elastic Film on a Viscous Layer", Mat. Res. Soc. Symp. Proc., vol. 695, 2002 Materials Research Society; pp. L3.14.1-L3.14.6.

Yin, et al., "Strain relaxation of SiGe islands on compliant oxide", Journal of Applied Physics, vol. 91, No. 12, Jun. 15, 2002, pp. 9716-9722.

"AmberWave and Aixtron to develop CVD equipment for SiGe and strained Si", http://www.compoundsemiconductor.net/articles/news/6/5/13/1, last printed Apr. 28, 2005.

Thompson, et al., "A Logic Nanotechnology Featuring Strained-Silicon", 2004 IEEE Electron Device Letters, vol. 25, No. 4, Apr. 2004, pp. 191-193.

Yang, et al., "High Performance CMOS Fabricated on Hybrid Substrate With Different Crystal Orientations", 2003 IEEE, pp. 18.7.1-18.7.4.

Thompson, et al., "A 90 nm Logic Technology Featuring 50nm Strained Silicon Channel Transistors, 7 layers of Cu Interconnects, Low k ILD, and 1 $um^2$ SRAM Cell", 2002 IEEE.

* cited by examiner

METHOD OF FORMING A CROSS-SECTION HOURGLASS SHAPED CHANNEL REGION FOR CHARGE CARRIER MOBILITY MODIFICATION

FIELD OF THE INVENTION

The invention relates generally to physical stress within semiconductor structures. More particularly, the invention relates to physical stress induced charge carrier mobility modification within semiconductor structures.

DESCRIPTION OF THE RELATED ART

Recent advances in semiconductor device design and development have involved the introduction of applied physical stress into semiconductor device components. Applied physical stress often leads to charge carrier mobility modification. In particular, enhanced charge carrier mobility generally leads to enhanced semiconductor device performance.

There are various examples of stress induced performance enhancement within semiconductor devices. For example, each of: (1) Thompson et al., in "A 90 nm Logic Technology Featuring 50 nm Strained Silicon Channel Transistors, 7 Layers of Cu Interconnects, Low k ILD, and 1 um$^2$ SRAM Cell, IEEE IEDM Tech. Digest 2002, pp. 61-64; (2) Ghani et al., in "A 90 nm High Volume Manufacturing Logic Technology Featuring Novel 45 nm Gate Length Strained Silicon CMOS Transistors," IEEE IEDM Tech. Digest 2003, pp. 978-80; and (3) Thompson et al., in "A Logic Nanotechnology Featuring Strained-Silicon," IEEE Electron Device Letters, Vol. 25, No. 4, April 2004, pp. 191-93 teaches tensile longitudinal channel region stress for n-FET performance enhancement and compressive longitudinal channel region stress for p-FET performance enhancement within CMOS devices. The compressive longitudinal channel region stress for p-FET performance enhancement may be effected by utilizing embedded silicon-germanium alloy epitaxial source/drain regions.

Other examples of compressive stress or tensile stress within various locations within semiconductor structures are alternatively known to provide charge carrier mobility modification. Typically, n-FET and p-FET devices respond differently to compressive and tensile stresses since piezoresistance coefficients will typically differ as a function of several variables, including but not limited to: semiconductor substrate doping and crystallographic orientation. Thus, stressed components within n-FET and p-FET devices often need to be specifically engineered and optimized.

More particularly with respect to crystallographic orientation, examples of semiconductor substrate crystallographic orientation induced performance enhancement within semiconductor devices are also known. For example, Yang et al., in "High Performance CMOS Fabricated on Hybrid Substrate With Different Crystallographic Orientations," IEEE IEDM Tech. Digest 2003, pp. 453-56 teaches p-FET performance enhancement when utilizing a (110) silicon orientation and n-FET performance enhancement when utilizing a (100) silicon orientation. The (110) silicon orientation and (100) silicon orientation may be fabricated within a single semiconductor substrate.

A trend in semiconductor device design and development is for continued enhanced performance at smaller dimensions. Thus, a need will continue to exist for novel structures and methods that, in turn, provide semiconductor devices with enhanced performance. To that end, the use of physically stressed structures in semiconductor devices is likely to continue. Desirable are alternative semiconductor structures and methods for fabrication that advantageously use physical stress for semiconductor device performance enhancement.

SUMMARY OF THE INVENTION

The invention provides a semiconductor structure having enhanced charge carrier mobility, and a method for fabricating the semiconductor structure.

To achieve the foregoing result, the invention provides a semiconductor substrate having a cross-section hourglass shaped channel region located therein. A stress imparting layer may be located adjacent a sidewall (i.e., laterally adjacent a sidewall or laterally adjoining a sidewall) of the hourglass shaped channel region, or a pair of stress imparting layers may be located adjacent or adjoining a pair of opposite sidewalls of the hourglass shaped channel region.

The term "hourglass shaped channel region" is used in the present invention to denote a channel region area of a semiconductor substrate having wider upper and lower regions as compared to a middle region which separates the upper and lower regions.

The invention is applicable to, but not limited to: field effect transistors. Within a field effect transistor structure, a gate electrode is located above the hourglass shaped channel region, and a pair of stress imparting layers is located adjacent and adjoining a pair of opposite sidewalls of the hourglass shaped channel region. The pair of stress imparting layers comprises a pair of source/drain regions.

Within the context of a particular (110) p-silicon semiconductor substrate crystallographic orientation, the hourglass shaped channel region, in conjunction with a pair of compressive stress imparting source/drain region layers, provides an enhanced vertical tensile stress while not compromising a desirable longitudinal compressive stress. Thus, a p-FET may be fabricated within the foregoing semiconductor substrate with enhanced hole charge carrier mobility performance.

The invention is not limited to either a field effect transistor as a semiconductor device or a (110) crystallographic orientation p-silicon semiconductor substrate. Rather, theoretical considerations provide that a cross-sectional hourglass shaped channel region within a semiconductor structure would likely provide enhanced vertical tensile stress in comparison with a non-hourglass shaped channel region, when a compressive stress imparting layer is located adjacent a sidewall thereof. The enhanced vertical tensile stress obtains since an hourglass shape provides a focus of applied physical stress that, in turn, provides for a denser stress topography contour gradient. The denser stress topography contour gradient needs only be mated with an appropriate semiconductor substrate crystallographic orientation and doping that benefits from the stress topography contour gradient. A (110) oriented p-silicon semiconductor substrate is one such substrate. Other appropriate semiconductor substrates may readily be determined by a person skilled in the art incident to analysis of crystallographic orientation specific piezoresistance coefficients.

The invention also provides a non-plasma etch method for forming the channel region with the cross-section hourglass shape. Under circumstances where the semiconductor substrate is formed of a silicon semiconductor material, such as, but not limited to: a bulk silicon semiconductor material or a silicon-on-insulator semiconductor material, the non-plasma etch method may comprise a halogen (i.e., fluorine or chlorine) containing etchant gas as well as a halogen and silicon containing deposition gas. By employing such a deposition gas, in conjunction with such an etchant gas, rather than an etchant gas alone, a cross-section hourglass shape is obtained when etching a masked semiconductor substrate to provide a masked mesa that comprises the hourglass shaped channel region within an etched semiconductor substrate.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this application, wherein.

DESCRIPTION OF THE PREFERRED EMBODIMENTS

The invention provides a semiconductor structure having enhanced charge carrier mobility, and a method for fabricating the semiconductor structure.

FIG. 1 to FIG. 4 show a series of schematic cross-sectional diagrams illustrating the results of progressive stages in fabricating a field effect transistor in accordance with an embodiment of the invention.

Figure 1:
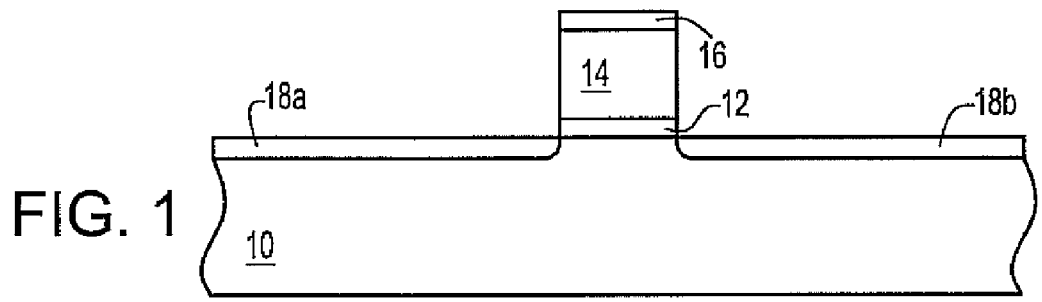
FIG. 1 to FIG. 4 show a series of schematic cross-sectional diagrams illustrating the results of progressive stages in forming a field effect transistor in accordance with an embodiment of the invention.

Specifically, FIG. 1 shows a semiconductor substrate 10 having a gate dielectric layer 12 located on a surface of the semiconductor substrate 10. A gate electrode 14 is located above the gate dielectric layer 12 and, in some embodiments, the gate electrode 14 is aligned to the gate dielectric layer 12. A capping layer 16 is generally located aligned upon the gate electrode 14. Finally, a pair of lightly doped extension regions 18a and 18b is located within the semiconductor substrate 10 and separated by a projected linewidth of the gate electrode 14. Each of the foregoing structures may be formed utilizing methods and materials as are conventional in the semiconductor fabrication art.

The semiconductor substrate 10 may comprise a bulk semiconductor substrate, or it may alternatively comprise a semiconductor-on-insulator semiconductor substrate. The semiconductor substrate 10 may comprise semiconductor materials including, but not limited to: silicon semiconductor materials, germanium semiconductor materials, silicon-germanium alloy semiconductor materials and compound semiconductor materials such as III-V and II-VI semiconductor materials. Finally, as will be illustrated in further detail in a drawing figure that follows, the semiconductor substrate 10 may also be laterally mated with an additional semiconductor substrate or semiconductor layer to provide a semiconductor substrate having at least two different laterally separated crystallographic orientations. Such a lateral mating may be effected while utilizing a single semiconductor substrate and fabricating at least one additional crystallographic region therein. Alternatively, a semiconductor substrate or a non-semiconductor substrate may be utilized and a minimum of two separate crystallographic orientation regions may be fabricated therein.

Within the instant embodiment, the semiconductor substrate 10 is typically a bulk silicon semiconductor substrate or a silicon-on-insulator semiconductor substrate, doped appropriately for forming a field effect transistor.

The gate dielectric layer 12 may comprise any of several dielectric materials as are conventional in the semiconductor fabrication art. Such dielectric materials may include, but are not limited to: an oxide, a nitride, an oxynitride or multilayers thereof. The gate dielectric layer 12 may have a dielectric constant from about 4.0 to about 20, as measured in vacuum. Alternative higher dielectric constant dielectric materials may also be utilized. The higher dielectric constant dielectrics include, but are not limited to: hafnium oxide materials, hafnium silicate materials, barium strontium titanate (BST) materials, lead zirconate titanate (PZT) materials and other ferroelectric materials. These dielectric materials will typically have a dielectric constant considerably greater than 20, and perhaps as high as about 100. Typically, the gate dielectric layer 12 when comprising a conventional thermal silicon oxide material has a thickness of about 10 to about 70 angstroms.

The gate electrode 14 typically comprises a highly doped polysilicon material (i.e., about 1e20 to about 1e21 dopant atoms per cubic centimeter). Alternative conductor materials may also be utilized. They may include, but are not limited to: conductive metals, metal alloys, metal suicides and metal nitrides, as well as composites and laminates thereof. The foregoing gate conductor materials may be deposited employing chemical vapor deposition and physical vapor deposition methods as are similarly also conventional in the semiconductor fabrication art. Typically, the gate electrode 14 has a thickness from about 1000 to about 1500 angstroms. When polysilicon is used, the polysilicon can be doped in-situ or doping may occur after deposition utilizing a conventional ion implantation process.

The capping layer 16 is optional within the invention. It often results from use of a hard mask layer when patterning the gate electrode 14 and the gate dielectric layer 12 from a corresponding pair of blanket layers. Thus, the capping layer 16 typically comprises a hard mask material, including, but not limited to: a nitride material, an oxide material or an oxynitride material. Typically, the capping layer 16 has a thickness from about 200 to about 500 angstroms.

Finally, the pair of lightly doped extension regions 18a and 18b results from an otherwise generally conventional ion implantation method while utilizing the capping layer 16, the gate electrode 14 and optionally the gate dielectric layer 12 as a mask. Typically, the pair of lightly doped extension regions 18a and 18b has an appropriate n or p polarity, and a dopant concentration from about 1e20 to about 1e21 dopant atoms per cubic centimeter. The pair of lightly doped extension regions 18a and 18b is also optional within some embodiments of the invention.

Figure 2:
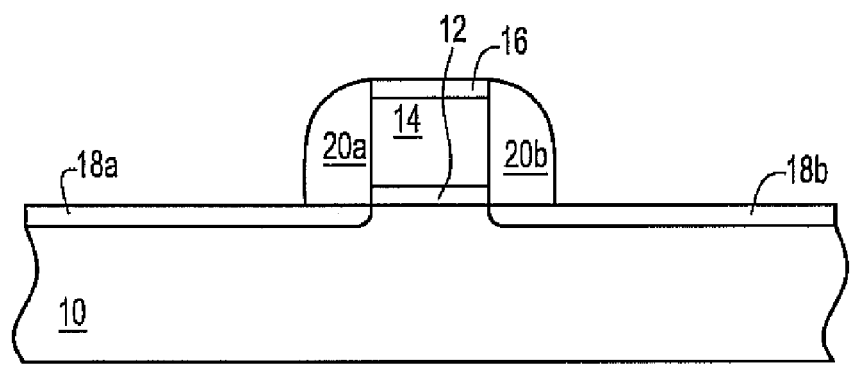

FIG. 2 shows a pair of spacer layers 20a and 20b located adjacent and adjoining a pair of opposite sidewalls of the capping layer 16, the gate electrode 14 and the gate dielectric layer 12. The pair of spacer layers 20a and 20b results from a conventional blanket spacer material layer deposition and anisotropic etchback process. The pair of spacer layers 20a and 20b may comprise any dielectric material such as, for example, oxides, nitrides, oxynitrides or multilayers thereof. Most common are silicon oxide materials, silicon nitride materials or silicon oxynitride materials that are deposited employing chemical vapor deposition or physical vapor deposition methods.

Figure 3:
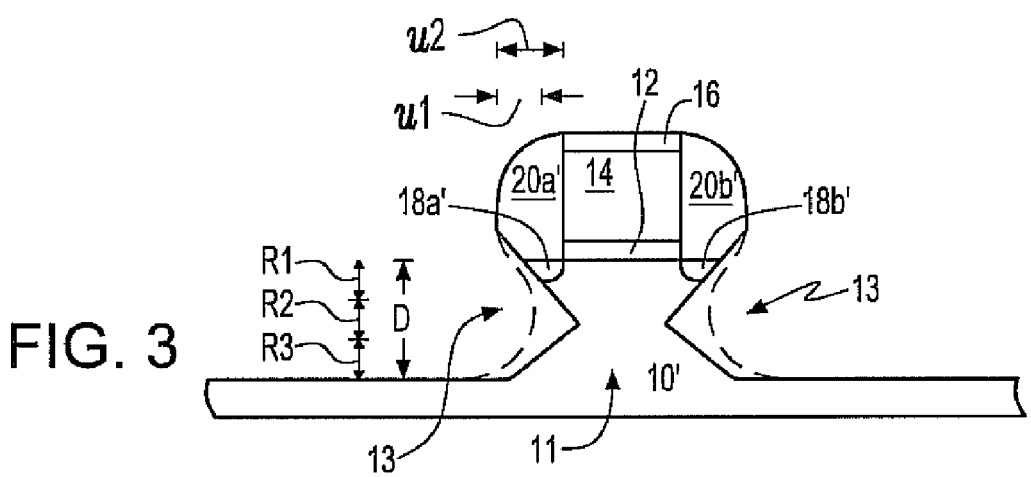

FIG. 3 shows an etched semiconductor substrate 10' that results from etching the semiconductor substrate 10 while utilizing the gate dielectric layer 12, the gate electrode 14, the capping layer 16 and the pair of spacer layers 20a and 20b as a mask. As is illustrated in FIG. 3, the etched semiconductor substrate 10' comprises a cross-sectional hourglass shaped channel region 11 located beneath the gate electrode 14. In addition, the etch method etches the pair of lightly doped extension regions 18a and 18b to form a pair of truncated lightly doped extension regions 18a' and 18b'. Finally, the etch method also etches the spacer layers 20a and 20b to form a pair of etched spacer layers 20a' and 20b'. However, etching of the spacer layers is not a requirement of the invention. Rather, the invention is operative whether or not a pair of spacer layers adjacent a gate electrode is etched somewhat when a semiconductor substrate is etched to yield a cross-section hourglass shaped channel region located beneath the gate electrode.

Within the instant embodiment and the invention, a "cross-section hourglass shaped channel region" is intended as a channel region which when viewed in cross-section has an upper region R1, a middle region R2 and a lower region R3 as designated in FIG. 3. The hourglass shape provides that a linewidth of the middle region R2 is less than a linewidth of either of the upper region R1 or the lower region R3. There is no specific requirement for comparative linewidths of the upper region R1 with respect to the lower region R3. Rather, each of those linewidths must be independently greater than a linewidth of the middle region R2. As will be discussed in greater detail below, the invention also contemplates that the hourglass shape may have a generally smoothly flowing sidewall contour as illustrated by the dashed lines corresponding with reference numerals 13. Alternatively, the invention also contemplates that the hourglass shape may have an angular sidewall contour (such as a faceted sidewall contour) as illustrated by the solid lines enclosed by the dashed lines corresponding with reference numerals 13. The faceted sidewall contour results from intersection of crystallographically specific planes of an hourglass shaped channel region. The remaining cross-sectional diagrams in this description will illustrate the instant embodiment within the context of an angular and faceted hourglass shaped channel region, although the invention is not so limited.

The invention provides that the cross-sectional hourglass shaped channel region 11 may be formed by etching the semiconductor substrate 10 while utilizing a non-plasma gaseous etch method. The non-plasma gaseous etch method in turn employs both an etchant gas and a deposition gas. The invention is not limited to the non-plasma gaseous etch method described as follows. Rather, the invention may also employ other etch methods that have at least some isotropic or crystallographically specific component that allows for etching a semiconductor substrate to yield a cross-section hourglass shape (having either smoothly flowing sidewalls, angular and faceted sidewalls or an influence of both types of sidewalls) of a channel region therein in accordance with the invention.

The inventive non-plasma gaseous etch method may in particular be utilized on a (100) silicon semiconductor substrate. With that crystallographic orientation, the etch method provides a faceted (i.e., crystallographic plane specific) etch and a resulting angular and faceted (i.e., planar adjoining surface) hourglass shaped channel region 11 as illustrated in FIG. 3. The inventive non-plasma gaseous etch method may also be applicable to other crystallographic orientations of silicon semiconductor materials and other semiconductor materials. Applicability is readily experimentally determined by a person skilled in the art by optical inspection of a channel region sidewall contour.

When the semiconductor substrate 10 comprises, consists essentially of, or consists of a silicon semiconductor material, the etchant gas may be a halogen containing etchant gas such as chlorine, fluorine, hydrogen chloride or hydrogen fluoride. Under those circumstances, the deposition gas is a silicon containing deposition gas and more particularly a silicon and halogen containing deposition gas. Silane, silicon fluorides and, more particularly, silicon chlorides are preferred for deposition gases.

The inventive non-plasma gaseous etch method preferably utilizes hydrogen chloride as an etchant gas and dichlorosilane as a deposition gas. The non-plasma gaseous etch method also utilizes: (1) a reactor chamber pressure from about 5 to about 15 torr and more preferable about 8 to 12 torr; (2) a semiconductor substrate temperature from about 750° to about 850° d and more preferably about 775° to 825°; (3) no source power or bias power; (4) a hydrogen chloride flow rate from about 100 to about 250 standard cubic centimeters per minute (more preferably from about 150 to about 200 standard cubic centimeters per minute) and a dichlorosilane flow rate from about 2 to about 10 standard cubic centimeters (more preferably about 3 to about 7 standard cubic centimeters per minute) in a hydrogen carrier gas flow from about 10 to about 30 standard liters per minute (more preferably about 15 to about 25 standard liters per minute. In accordance with the following dimensional parameters for the hourglass shaped channel region 11, an etch time of about 100 seconds is typical.

As is illustrated in FIG. 3, the instant embodiment provides that the top of the hourglass shaped channel region 11 is undercut by a first undercut distance U1 of about 200 to about 250 angstroms laterally beneath the pair of etched spacers 20a' and 20b' formed from the pair of spacers 20a and 20b. FIG. 3 also illustrates a maximum undercut U2 of the hourglass shaped channel region 11 with respect to the pair of etched spacers 20a' and 20b'. The maximum undercut U2 is about 400 to about 500 angstroms. FIG. 3 finally also shows a depth D for etching the within the etched semiconductor substrate 10'. It corresponds with the height of the cross-section hourglass shaped channel region 11. The depth D is about 500 to about 2000 angstroms.

Figure 4:
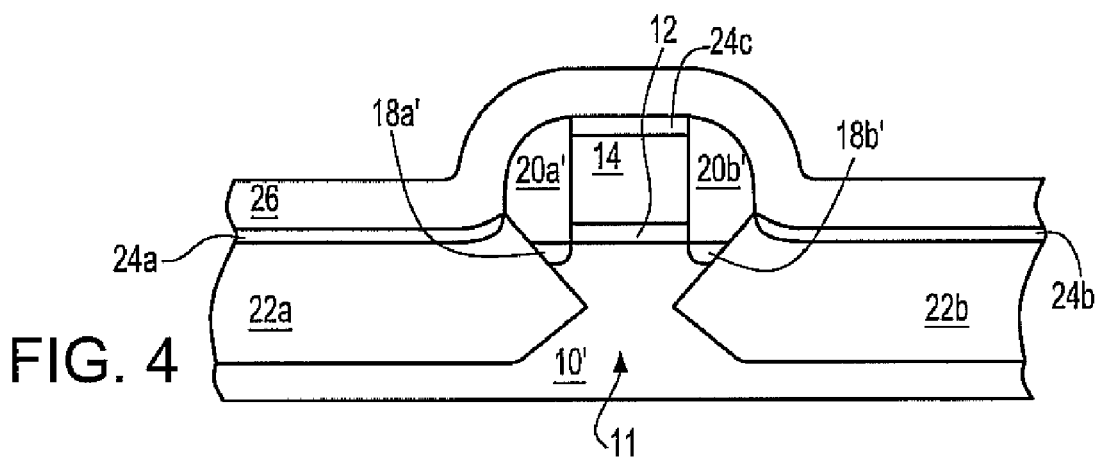

FIG. 4 first shows a pair of source/drain regions 22a and 22b located adjacent and adjoining a pair of opposite sidewalls of the cross-section hourglass shaped channel region 11. Each of the pair of source/drain regions 22a and 22b imparts a longitudinal compressive stress to the hourglass shaped channel region 11. Preferably, the pair of source/drain regions 22a and 22b comprises an epitaxially deposited doped silicon-germanium alloy material. Such a material intrinsically imparts a longitudinal compressive stress since germanium atoms are larger than silicon atoms and thus a silicon-germanium alloy lattice would of necessity have larger lattice constants and space requirements than a silicon lattice. Preferably, each of the pair of source/drain regions 22a and 22b comprises a germanium content from about 15 to about 25 atom percent, although the invention is not so limited.

An epitaxial silicon-germanium alloy source/drain region is particularly convenient within the instant embodiment. However, the invention is not intended to be so limited. Rather, the invention also contemplates that any other appropriate conductor material that may alternatively be employed for forming a source/drain region may also be employed within the invention provided that it imparts a proper stress into the hourglass shaped channel region 11. Epitaxially deposited highly doped semiconductor materials are desirable and most common. Alternatively, amorphous or polycrystalline conductor materials may be applicable and appropriate in certain semiconductor device structures.

FIG. 4 also shows implicitly by its absence the results of stripping the capping layer 16 from the gate electrode 14. The capping layer 16 may be stripped while utilizing methods and materials as are conventional in the semiconductor fabrication art. Non-limiting examples of methods and materials include wet chemical and dry plasma methods and materials. In particular, when the capping layer 16 is comprised of a silicon nitride material, a phosphoric acid etchant material at elevated temperature is an effective etchant material.

FIG. 4 also shows a series of optional silicide layers 24a, 24b and 24c. A pair of the optional silicide layers 24a and 24b is located upon the pair of source/drain regions 22a and 22b. A single optional silicide layer 24c is located atop the gate electrode 14 in place of the capping layer 16. The series of silicide layers 24a, 24b and 24c may result from a self-aligned silicide (i.e., salicide) method that, in turn, employs a blanket metal silicide forming metal layer deposition, a thermal annealing and an excess regiospecific unreacted metal etch. A single anneal or a two step anneal can be employed in forming the silicide layers 24a, 24b and 24c. Typical metal silicide forming metals include, but are not limited to: titanium, tungsten, platinum, cobalt and nickel. Typically each of the series of metal silicide layers 24a, 24b and 24c, when and if present, has a thickness from about 50 to about 300 angstroms.

Finally, FIG. 4 shows an etch stop liner layer 26 located covering the field effect transistor device as illustrated in FIG. 4. It is located upon the series of silicide layers 24a, 24b and 24c and the pair of etched spacer layers 20a' and 20b'. The etch stop liner layer 26 typically comprises a dielectric material. More typically, it comprises a silicon nitride or silicon oxynitride dielectric material. Typically it has a thickness from about 200 to about 1000 angstroms. The etch stop liner layer 26 may be formed utilizing conventional methods, including, but not limited to: chemical vapor deposition methods and physical vapor deposition methods.

FIG. 4 shows a field effect transistor in accordance with an embodiment of the invention. The field effect transistor comprises a semiconductor substrate comprising a cross-section hourglass shaped channel region. Laterally adjacent both sidewalls of the channel region is a pair of stress imparting source/drain regions. When the channel region comprises a particular semiconductor material and crystallographic orientation, the hourglass shape of the channel region provides for enhanced vertical tensile stress in the channel region and thus enhanced vertical charge carrier mobility.

Piezoresistance coefficients for semiconductor substrates typically vary as a function of both dopant polarity and crystallographic orientation. For a (001) orientation silicon semiconductor substrate having either n or p doping, axially specific piezoresistance coefficients are as follows (units are e-11/pascal). For n silicon, piezoresistance coefficients in the longitudinal, transverse and vertical direction are −31.6, −17.6 and 53.4. For p silicon, piezoresistance coefficients in the longitudinal, transverse and vertical direction are 71.8, −66.3 and −1.1. As an additional option, for a (110) crystallographic orientation p silicon semiconductor substrate piezoresistance coefficients in the longitudinal, transverse and vertical direction are 71.8, −1.1 and −66.3.

Since the longitudinal piezoresistance coefficients differ in magnitude for n silicon and p silicon for the above semiconductor substrate options independent of crystallographic orientation, n-FET and p-FET transistors must of necessity be fabricated with different stress imparting structures to provide appropriate longitudinal tensile channel stress in an n-FET and compressive channel stress in a p-FET. For a p-FET, a (110) crystallographic orientation silicon semiconductor substrate is desirable since the same is quite responsive to a longitudinal compressive stress and a vertical tensile stress. A (001) crystallographic orientation silicon semiconductor substrate for an n-FET is desirable since the same is typically a bulk semiconductor substrate.

Thus, the invention contemplates that an n-FET is preferably formed in a (001) silicon semiconductor substrate and a p-FET is preferably formed in a (110) silicon semiconductor substrate. A cross-sectional diagram illustrating such a structure is shown in FIG. 5.

Figure 5:
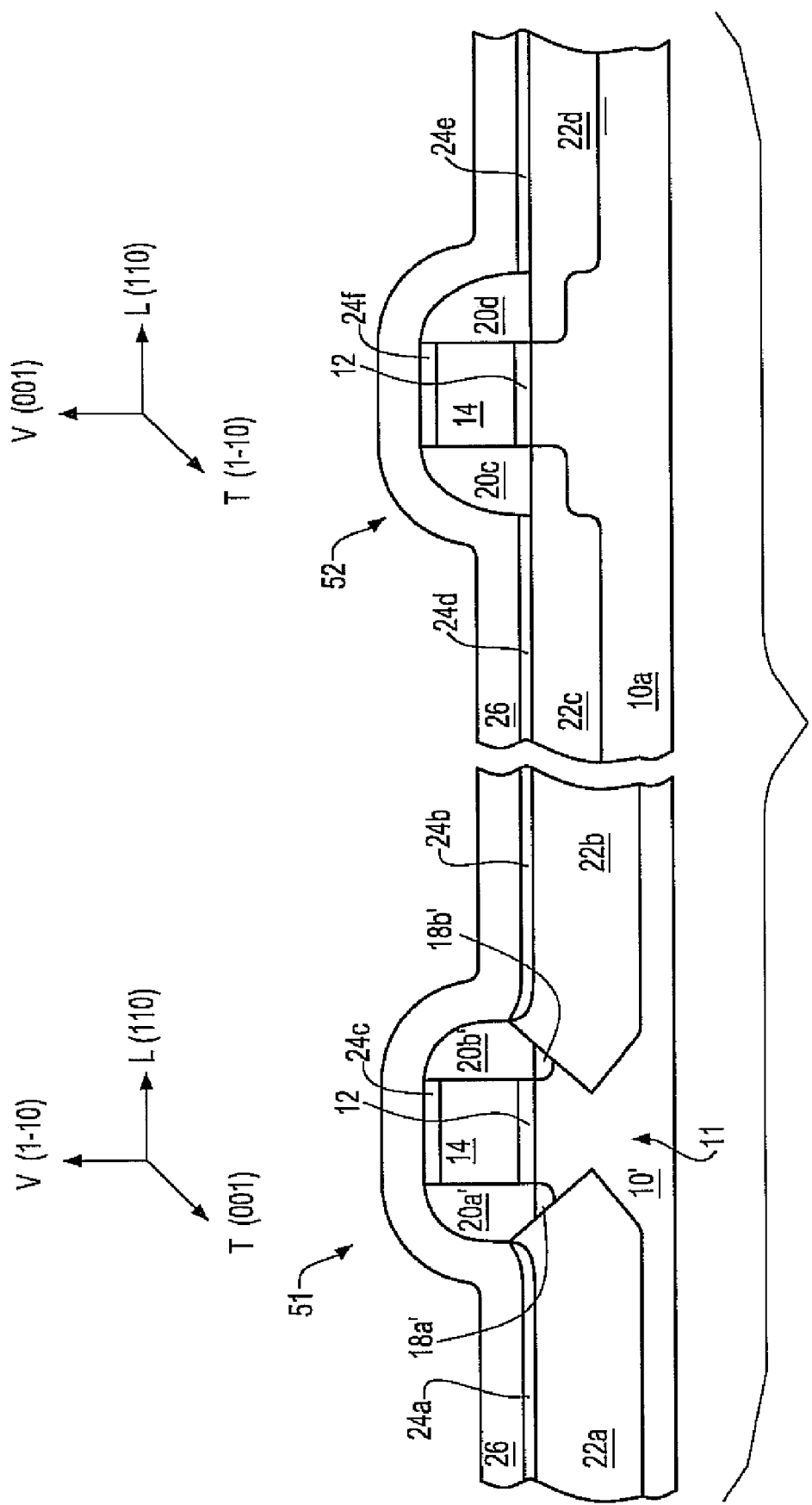
FIG. 5 shows a schematic cross-sectional diagram of a CMOS structure having a p field effect transistor in accordance with the invention located therein.

FIG. 5 shows the p-FET 51 of FIG. 4, separated from an n-FET 52 having a more conventional structure. They are intended as fabricated within different crystallographic orientation regions of a single semiconductor substrate. Methods for fabricating such a single semiconductor substrate are disclosed by Yang et al., IEEE IEDM 2003, pp. 453-56, as cited in the Description of the Related Art.

The n-FET 52 utilizes a semiconductor substrate 10a of different crystallographic orientation in comparison with the etched semiconductor substrate 10' as utilized in the p-FET. A gate dielectric layer 12, gate electrode 14 and silicide layer 24f (i.e., a gate electrode stack) are aligned and located stacked upon the semiconductor substrate 10a. A pair of spacer layers 20c and 20d is located covering a pair of opposite sidewalls of the gate electrode stack. A pair of source/drain regions 22c and 22d that includes a pair of lightly doped extension regions is located within the semiconductor substrate 10a and separated by a channel region beneath the gate electrode stack. An additional pair of silicide layers 24d and 24e is located upon the pair of source/drain regions 22c and 22d. Finally, an etch stop liner layer 26' is located upon and covers the other components of the n-FET 52 structure.

Most of the foregoing structures are formed analogously with the corresponding structures within the p-FET device 51. Differences exist for the source/drain regions 22a and 22b within the p-FET and the source/drain regions 22c and 22d within the n-FET. The latter are formed utilizing a generally conventional two step ion implantation method. The two step method utilizes the gate electrode stack absent the silicide layer 24f as an ion implantation mask, with and without the pair of spacer layers 20c and 20d. Also, the etch stop liner layer 26' within the n-FET, while typically formed of the same material as the p-FET etch stop liner layer 26 may in fact provide different stress properties since a p-FET and an n-FET require different stress properties for charge carrier mobility enhancements.

The foregoing description is not intended to limit the n-FET device 52. For example and without limitation, other spacer and implant combinations are also contemplated within the n-FET 52. Additional spacer layers such as but not limited to: double spacer layers and triple spacer layers, may be utilized to add additional ion implant structures. Non-limiting examples of additional ion implant structures are buffer ion implant structures.

FIG. 5 also shows the resulting longitudinal, transverse and vertical crystallographic axes orientations for the p-FET 51 formed in a (110) silicon semiconductor substrate and the n-FET 52 formed in a (001) silicon semiconductor substrate.

FIG. 5 shows a CMOS structure having a p-FET 51 located within a (110) silicon semiconductor substrate having a cross-section hourglass shaped channel region and epitaxial silicon-germanium alloy compressive stressed source/drain regions. An accompanying n-FET 52 is located within a (001) silicon semiconductor substrate absent the hourglass shaped channel region and the epitaxial compressive stress imparting source/drain regions. In accordance with the instant embodiment, use of different crystallographic orientation and stress characteristics within the n-FET and p-FET provide for individually optimized charge carrier performance of the n-FET and p-FET.

In order to illustrate the value of the invention, stress topography computer simulations were undertaken for field effect transistor structures having embedded silicon-germanium alloy epitaxial source/drain regions. The structures included cross-section straight sidewall channel regions and cross-section hourglass shaped channel regions.

Figure 7:
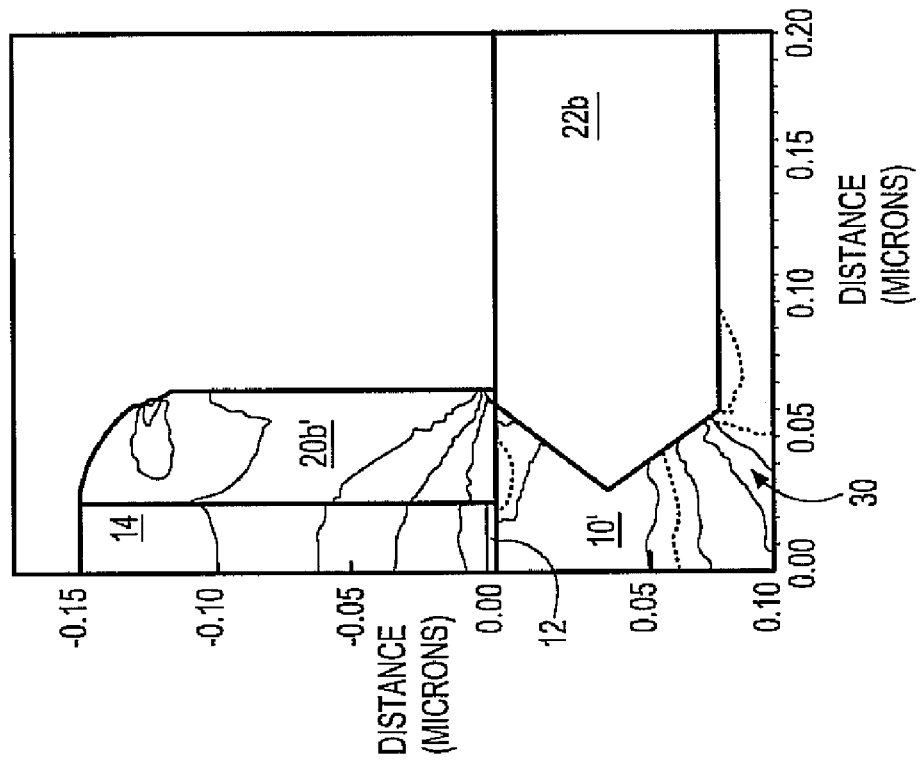
FIG. 6 and FIG. 7 show a pair of stress topography graphs for longitudinal stress within a field effect transistor not in accordance with the invention, and in accordance with the invention.
Figure 6:
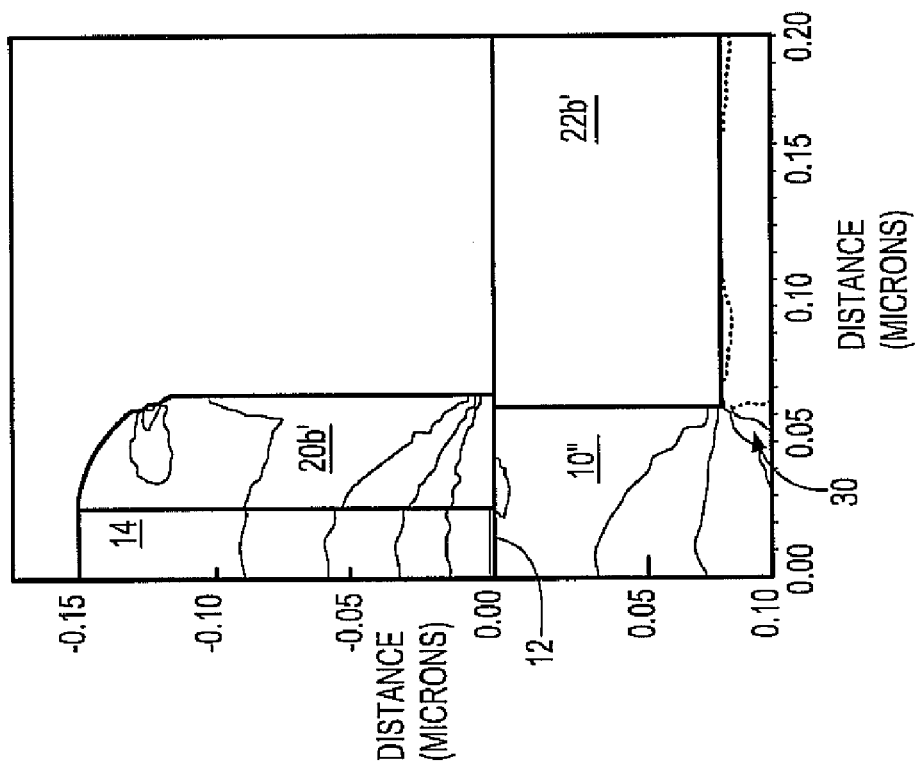

FIG. 6 and FIG. 7 show a pair of longitudinal stress topography graphs for a pair of field effect transistors in accordance with the above description.

FIG. 6 shows an etched semiconductor substrate 10'' comprising a channel region that has a straight sidewall. A gate electrode 14 with gate dielectric layer 12 aligned thereunder are located over the channel region. A spacer 20b' laterally adjoins the gate electrode 14. A compressive stress imparting source/drain region 22b' laterally adjoins the channel region. The stress topography diagram of FIG. 6 assumes that all layers and structures have no intrinsic stress with the exception of the source/drain region 22b'. It is assumed to have an intrinsic compressive stress of −1500 megapascals. A zero stress contour line corresponds with reference numeral 30. Contour lines to the left of the zero stress line are compressive. Contour lines to the right of the zero stress line are tensile. The computer simulation suggests that a longitudinal compressive stress of −450 megapascals is realized at mid-channel.

FIG. 7 corresponds with FIG. 6, with the exception of the presence of an angular cross-section hourglass shaped channel region and a complementary stress imparting source/drain region 22b. Reference numeral 30 still corresponds with the zero stress contour line. Contour lines to the left thereof are still compressive and contour lines to the right are still tensile. FIG. 7 is intended to correspond with the preferred embodiment of the invention. As is illustrated in FIG. 7, the stress topography profile does not differ appreciably in comparison with FIG. 6. A mid-channel compressive stress of about −440 megapascals is estimated.

Figure 9:
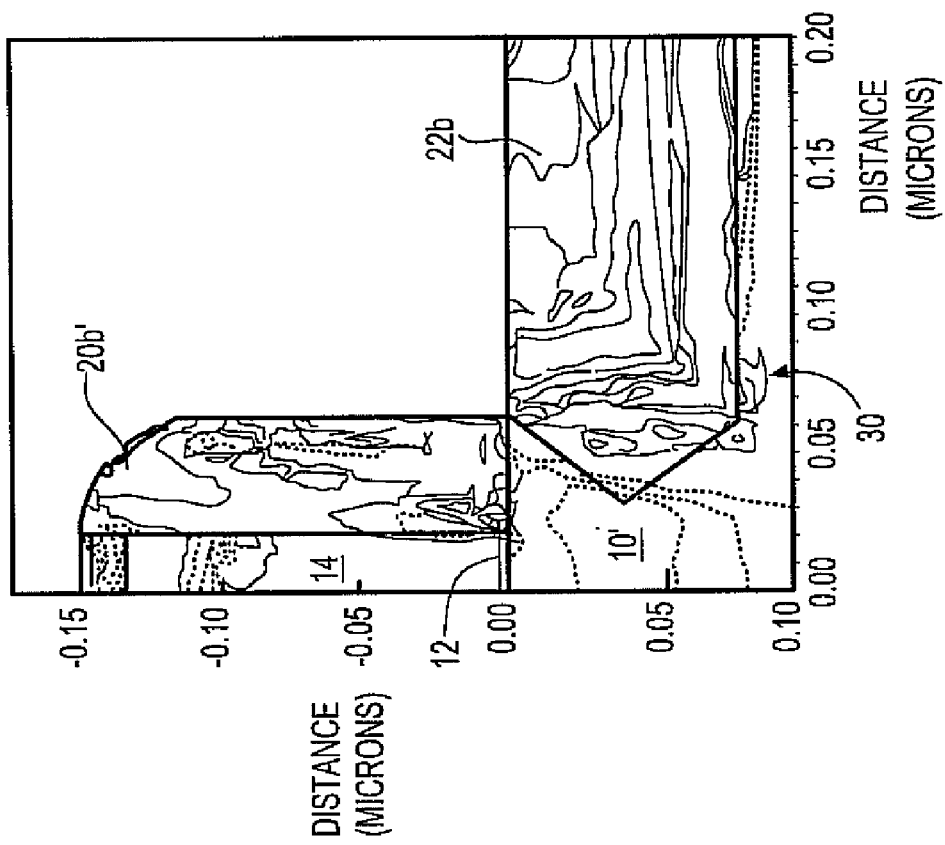
FIG. 8 and FIG. 9 show a pair of stress topography graphs for vertical stress within a field effect transistor not in accordance with the invention, and in accordance with the invention.
Figure 8:
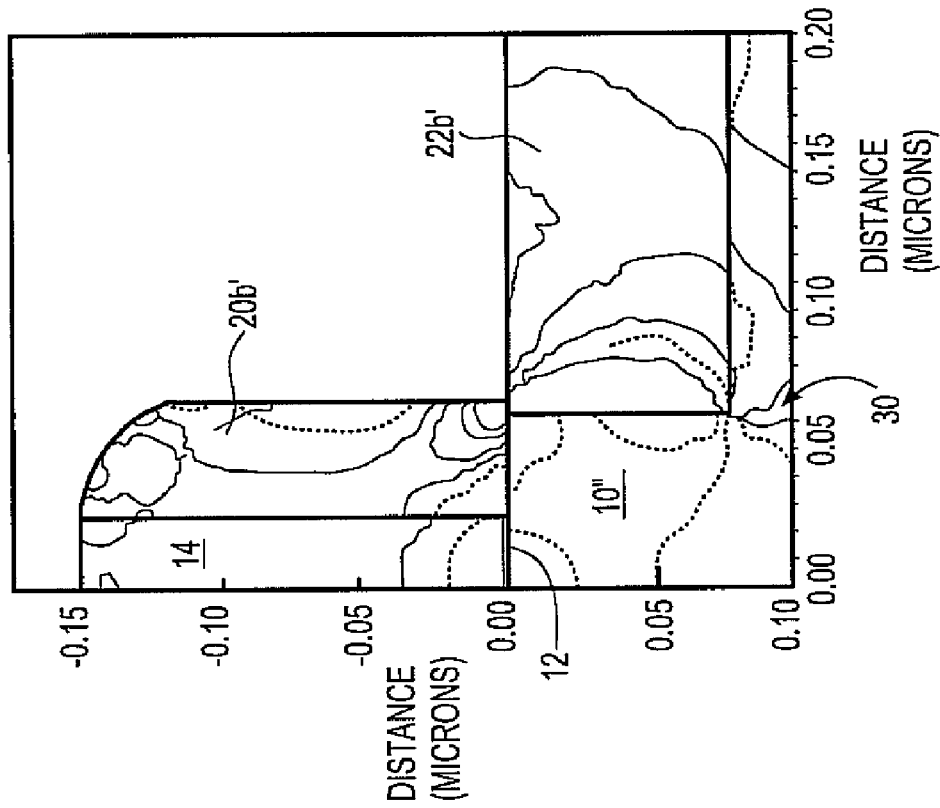

FIG. 8 and FIG. 9 correspond with FIG. 6 and FIG. 7, but are vertical stress topography graphs rather than longitudinal stress topography graphs. FIG. 8 illustrates the cross-section straight sided channel region and FIG. 9 illustrates the cross-section hourglass shaped channel region. FIG. 8 and FIG. 9 also illustrate a zero stress contour line corresponding with reference numeral 30. However, tensile stress contour lines are to the left of the zero stress contour line and compressive stress contour lines are to the right of the zero stress contour line.

As is illustrated in FIG. 8 and FIG. 9, considerable differences in vertical stress exist as a function of straight sidewall or hourglass shape for a channel region. For the straight sidewall channel region, a mid-channel vertical stress is estimated as 240 megapascals tensile. For the hourglass shaped channel region, mid-channel vertical stress is estimated as 410 megapascals tensile.

As is seen from review of the data contained in FIG. 6 to FIG. 9, a cross-section hourglass shaped channel region in conjunction with a compressive stressed source/drain region adjacent thereto in a field effect transistor structure does not substantially influence a longitudinal stress, but it does substantially influence a vertical stress. Thus, when utilizing an appropriate semiconductor substrate crystallographic orientation and doping, an overall increase in charge carrier mobility is expected for a field effect transistor structure with a cross-section hourglass shaped channel region in accordance with the invention.

The preferred embodiments of the invention are illustrative of the invention rather than limiting of the invention. Revisions and modifications may be made to methods, materials, structures and dimensions of a semiconductor structure in accordance with the preferred embodiments of the invention, while still providing a semiconductor structure and method in accordance with the invention, further in accordance with the accompanying claims.

What is claimed is:

1. A method for fabricating a semiconductor structure comprising:
    forming a gate structure on a semiconductor substrate to provide a masked portion of the semiconductor substrate and an exposed portion of the semiconductor substrate;
    etching the exposed portion of the semiconductor substrate to recess the exposed portion of the semiconductor substrate relative to the masked portion of the semiconductor substrate with an etchant that is a non-plasma gaseous etchant comprising an etchant gas comprised of chlorine, fluorine, hydrogen chloride, hydrogen fluoride or a combination thereof, and a deposition gas comprised of silane, silicon fluoride, silicon chloride or a combination thereof, wherein the etchant applied to the semiconductor substrate produces a channel region in the masked portion of the semiconductor substrate having a cross-section hourglass shape; and
    forming source and drain regions on the exposed portions of the semiconductor substrate that have been recessed relative to the masked portion of the semiconductor substrate, wherein the source and drain regions induce a stress on the channel region.

2. The method of claim 1 wherein the hourglass shape is an angular and faceted hourglass shape.

3. The method of claim 1 wherein:
    the semiconductor substrate comprises a silicon semiconductor material; and
    the non-plasma gaseous etchant comprises a halogen containing etchant gas and a silicon and halogen containing deposition gas.

4. The method of claim 1 wherein the channel region is composed of silicon and the source and drain regions are composed of silicon germanium.

5. A method for fabricating a semiconductor structure comprising:
    forming a gate structure on a semiconductor substrate to provide a masked portion of the semiconductor substrate and an exposed portion of the semiconductor substrate, the gate structure includes a gate stack comprising a gate conductor overlying a gate dielectric and spacers abutting the gate stack;
    etching the exposed portion of the semiconductor substrate to recess the exposed portion of the semiconductor substrate relative to the masked portion of the semiconductor substrate with an etchant that is a non-plasma gaseous etchant comprising an etchant gas and a deposition gas, wherein the etchant applied to the semiconductor substrate produces a channel region in the masked portion of the semiconductor substrate having a cross-section hourglass shape, wherein the etching of the exposed portion of the substrate removes a portion of the spacers that is in contact with the semiconductor substrate; and
    forming source and drain regions on the exposed portions of the semiconductor substrate that have been recessed relative to the masked portion of the semiconductor substrate, wherein the source and drain regions induce a stress on the channel region.

6. The method of claim 5 wherein the hourglass shape is an angular and faceted hourglass shape.

7. The method of claim 5 wherein:
    the semiconductor substrate comprises a silicon semiconductor material; and the non-plasma gaseous etchant comprises a halogen containing etchant gas and a silicon and halogen containing deposition gas.

8. The method of claim 5 wherein the etchant gas is comprised of chlorine, fluorine, hydrogen chloride, hydrogen fluoride or a combination thereof, and the deposition gas is comprised of silane, silicon fluoride, silicon chloride or a combination thereof.

9. The method of claim 5 wherein the channel region is composed of silicon and the source and drain regions are composed of silicon germanium.

* * * * *